United States Patent [19]

Miwada

[11] Patent Number: 5,196,719
[45] Date of Patent: Mar. 23, 1993

[54] SOLID-STATE IMAGE PICK-UP DEVICE HAVING ELECTRIC FIELD FOR ACCELERATING ELECTRIC CHARGES FROM PHOTOELECTRIC CONVERTING REGION TO SHIFT REGISTER

[75] Inventor: Kazuo Miwada, Tokyo, Japan

[73] Assignee: NEC Corporation, Tokyo, Japan

[21] Appl. No.: 931,434

[22] Filed: Aug. 18, 1992

Related U.S. Application Data

[63] Continuation of Ser. No. 699,828, May 14, 1991, abandoned.

[30] Foreign Application Priority Data

May 14, 1990 [JP] Japan .................................. 2-123691

[51] Int. Cl.[5] ...................... H01L 29/78; H01L 27/14; H01L 31/00
[52] U.S. Cl. .................................. 257/233; 257/240; 257/245; 257/225
[58] Field of Search ................. 357/24 LR, 24, 30 H; 250/211 J

[56] References Cited

U.S. PATENT DOCUMENTS 4,987,466  1/1991  Shibata et al. ................. 357/24 LR

FOREIGN PATENT DOCUMENTS 0125732  11/1984  European Pat. Off. .
0333260   9/1989  European Pat. Off. .
60-257574 12/1985  Japan .
62-296463 12/1987  Japan .
0360595   3/1990  Japan .

Primary Examiner—Rolf Hille
Assistant Examiner—Robert Limanek
Attorney, Agent, or Firm—Sughrue, Mion, Zinn, Macpeak & Seas

[57] ABSTRACT

A solid-state image pick-up device is fabricated on a p-type semiconductor substrate, and having a plurality of photo-electric converters respectively having n-type impurity regions and formed in a surface portion of the semiconductor substrate at spacings, a shift register having an n-type charge transfer region separated from the n-type impurity regions by respective channel forming regions, a thin insulating film covering the channel forming regions and outlet subregions of the n-type impurity regions, and a transfer gate electrode extending on the thin insulating film, wherein the transfer gate electrode is shaped in such a manner as to create an electric field over each outlet subregion and the associated channel forming region so that carriers are accelerated from each outlet subregion through the associated channel forming region to the shift register.

5 Claims, 9 Drawing Sheets

SOLID-STATE IMAGE PICK-UP DEVICE HAVING ELECTRIC FIELD FOR ACCELERATING ELECTRIC CHARGES FROM PHOTOELECTRIC CONVERTING REGION TO SHIFT REGISTER

This is a continuation of application No. 07/699,828 filed May 14, 1991 now abandoned.

FIELD OF THE INVENTION

This invention relates to a solid-state image pick-up device and, more particularly, to an outlet region of a photo-electric converting region contiguous to a channel forming region associated with a shift register for creating an electric field accelerating electric charges.

DESCRIPTION OF THE RELATED ART

A solid-state image pick-up device has found a wide variety of application such as, for example, an image sensor incorporated in an automatic focusing mechanism of a camera or in a facsimile machine.

Referring to FIGS. 1 to 3, a typical example of the solid-state image pick-up device is fabricated on a p-type silicon substrate 1. Although a thick oxide film 2 covers the entire surface of the silicon substrate 1, the thick oxide film 2 is partially removed from the silicon substrate 1 in FIG. 1 for better understanding. In the silicon substrate 1 are formed a plurality of n-type rectangular regions NR1 arranged in staggered manner which provide photo-electric converting regions 3a, 3b and 3c together with p-type impurity regions PR1 overlapped therewith. Another n-type impurity region NR2 is formed in the silicon substrate 1, and is connectable to every other photo-electric converting region 3b through a p-type channel forming area of the silicon substrate 1. The n-type rectangular region 3b has an outlet subregion 4 which is contiguous to the channel forming area. The n-type rectangular regions NR1 and the n-type impurity region NR2 are surrounded by a heavily doped p-type channel stopper 5 which is hatched in the drawings so as to be easily discriminated from n-type impurity regions NR1 and NR2.

A large number of gate electrodes 6a, 6b, 6c, 6d, 6e, 6f and 6g are provided over the n-type impurity region NR2, and each of the gate electrodes 6a to 6g is partially overlapped with those located on both sides thereof. A phase-one transferring clock signal CLK1 and a phase-two transferring clock signal CLK2 are selectively supplied to the gate electrodes 6a to 6g, and the n-type impurity region NR2 and the gate electrodes 6a to 6g as a whole constitute a multi-stage vertical shift register 7 of the CCD type.

A strip of transfer gate electrode 8 extends over the channel forming areas, and is partially overlapped with the outlet subregion 4. A transfer signal TR is supplied to the transfer gate electrode 8, thereby allowing electric charges accumulated in the photo-electric converting region 3b to flow into the vertical shift register 7. The outlet subregion 4 beneath the transfer gate electrode 8 has a width W and a length L, and a problem inherent in the prior art solid-state image pick-up device will be hereinlater described in conjunction with the width W and the length L. The solid-state image pick-up device thus arranged is covered with a photo-shield plate 9, however, a slit 9a formed in the photo-shield plate 9 exposes the photo-electric converting regions 3a to 3c to photo radiation carrying images.

Description is briefly made on the image pick-up operation. While the transfer signal TR remains in an inactive low voltage level, photo radiation is fallen onto the photo-electric converting regions 3a to 3c, and is converted to electric charges. The amount of the electric charges depends on the intensity of the photo radiation. The electric charges thus accumulated in the photo-electric converting regions 3a to 3c flow into transfer stages of the vertical shift register 7 upon application of the transfer clock signal TR of an active high voltage level. The electric charges accumulated in the photo-electric converting region 3b is transferred through the outlet subregion 4 and the channel forming area to the vertical shift register 7. The electric charges are conveyed from stage to stage in synchronism with the phase-one and phase-two clock signals CLK1 and CLK2, and are read out to the outside thereof as an image carrying signal through a horizontal shift register (not shown) in a case of area image pick-up device or directly in a case of linear image pick-up device.

The prior art solid-state image pick-up device has a drawback in that after images tend to take place on a display unit supplied with the image carrying signal, and residual electric charges left in the outlet subregion 4 are causative of the after images. In detail, while the transfer signal TR remains low, the outlet subregion 4 and the associated channel forming area have the respective bottom edges E0 and E1 of the conduction bands indicated by broken lines, and the channel forming area provides a potential barrier against the electric charges accumulated in the photo-electric converting region 3b. When the transfer signal TR goes up to the active high voltage level, the bottom edge E0 in the outlet subregion 4 becomes lower than the bottom edge E1 in the channel forming area indicated by real lines, and a potential well WL takes place in the outlet subregion 4. Most of the electric charges accumulated in the photo-electric converting region 3b pass through the outlet subregion 4 and the channel forming area to the vertical shift register 7, however, residual electric charges are left in the potential well WL. Even if the photo radiation fallen onto the photo-electric converting region 3b is negligible, the residual electric charges gradually flow into the vertical shift register 7 in the presence of the transfer signal TR of the active high voltage level, and ride on the image carrying signal. The residual electric charges thus swept into the vertical shift register 7 form after images on the associated display unit regardless of photo radiation.

Since the potential well WL is produced in the outlet subregion 4, the amount of the residual electric charges is decreased together with the width W and the length L. However, this approach encounters other serious problems.

If the length L is too short as shown in FIGS. 4 and 5, undesirable potential barrier PB takes place in the outlet subregion 4 as shown in FIG. 6. In detail, if the length L is shorter than a distance Ld between the p-type impurity region PR1 and the p-type silicon substrate 1, the bottom edge of the p-type impurity region PR1 becomes closer to the p-type silicon substrate 1 along a vertical boundary surface VS of the n-type rectangular region NR1, and is separated therefrom again around the outlet subregion 4 beneath the transfer gate electrode 8. A narrow portion takes place in the n-type rectangular region NR1, and depletion regions extending from the p-type impurity region PR1 and the silicon substrate 1 deform the bottom edge in the narrow portion lower with respect to that in the outlet subregion 4 beneath the transfer gate electrode 8. This results in the potential barrier PB. Since the potential barrier PB blocks electric charges, the solid-state image pick-up device with the short length L also suffers from after images.

An outlet subregion 4 with a small width W is causative of another problem. FIGS. 7 and 8 shows an outlet subregion with a small width W, however, the thick oxide film 2 and the photo-shield plate 9 are removed from the solid-state image pick-up device. If the width W is decreased, the narrow outlet subregion 4 restricts the amount of electric charges passing therethrough, and all of the electric charges produced by photo radiation hardly diffuse over the narrow outlet subregion 4 into the vertical shift register 7 in the presence of the transfer signal TR of the active high voltage level. The residual electric charges in the photo-electric converting region $3b$ produce after images on an associated display unit.

An outlet subregion 4 as wide as 10 microns as shown in FIG. 10A smoothly transfers electric charges, and the amount of after images is not increased even if the transfer signal TR is made short (see dots in FIG. 10C). However, since the wide outlet subregion 4 accumulates residual electric charges due to the potential well WL, the after images are maintained in a relatively high level. On the other hand, if the outlet subregion 4 is decreased to 5 microns as shown in FIG. 10B, the amount of after images is relatively small in so far as the transfer signal TR is equal to or greater than 1 microsecond. However, the amount of the after images is drastically increased in the presence of the transfer signal TR less than 1 microsecond (see bubbles in FIG. 10C).

Thus, various parameters affect the production of after images, and a new and useful solid-state image pick-up device is expected for improved images.

SUMMARY OF THE INVENTION

It is therefore an important object of the present invention to provide a solid-state image pick-up device which is free from after images.

To accomplish these objects, the present invention proposes to accelerate electric charges with electric field produced along an outlet subregion.

In accordance with the present invention, there is provided a solid-state image pick-up device comprising a) a semiconductor substrate of a first conductivity type, b) a plurality of photo-electric converting regions having first impurity regions of a second conductivity type opposite to the first conductivity type, respectively, and formed in a surface portion of the semiconductor substrate at spacings, c) a shift register having a charge transfer region of the second conductivity type separated from the first impurity regions by respective channel forming regions of the first conductivity type, d) a thin insulating film covering the channel forming regions and outlet subregions of the first impurity regions, the outlet subregions being contiguous to the channel forming regions, respectively, and e) a transfer gate electrode extending on the thin insulating film and shaped in such a manner as to create an electric field over each outlet subregion and the associated channel forming region for accelerating carriers from aforesaid each outlet subregion through the associated channel forming region to the shift register.

BRIEF DESCRIPTION OF THE DRAWINGS

The features and advantages of the solid-state image pick-up device according to the present invention will be more clearly understood from the following description taken in conjunction with the accompanying drawings in which:

FIG. 8 is an energy diagram showing the bottom edges of the conduction bands created in the essential part shown in FIG. 16.

DESCRIPTION OF THE PREFERRED EMBODIMENTS

FIRST EMBODIMENT

Figure 1:
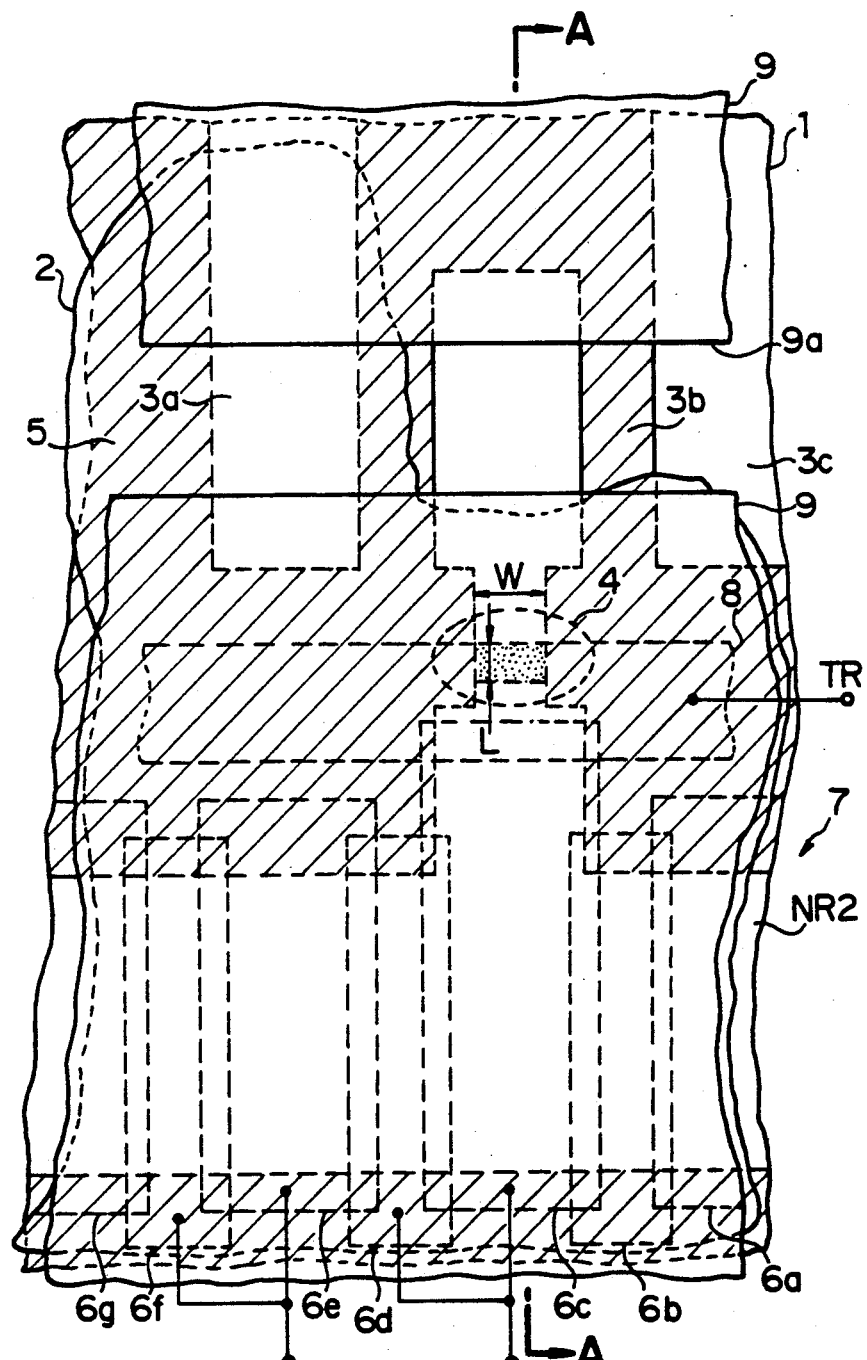
FIG. 1 is a plan view showing the layout of the prior art solid-state image pick-up device.
Figure 2:
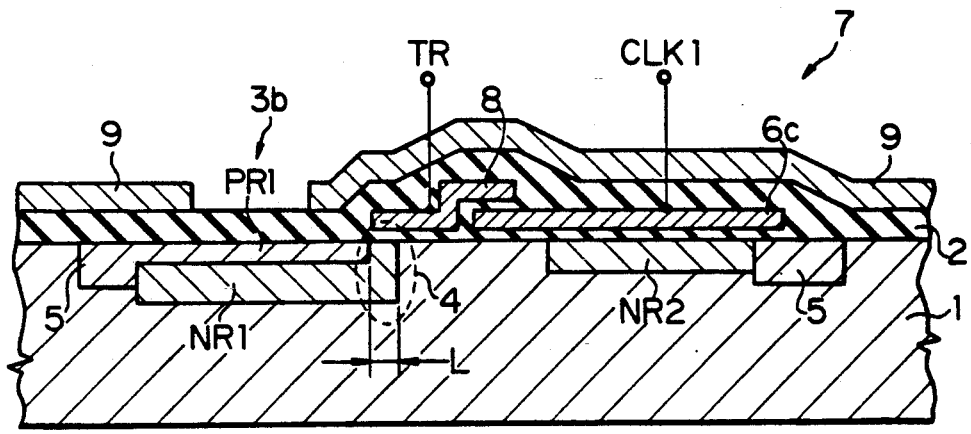
FIG. 2 is a cross sectional view taken along line A—A of FIG. 1 showing the structure of the prior art solid-state image pick-up device.
Figure 3:
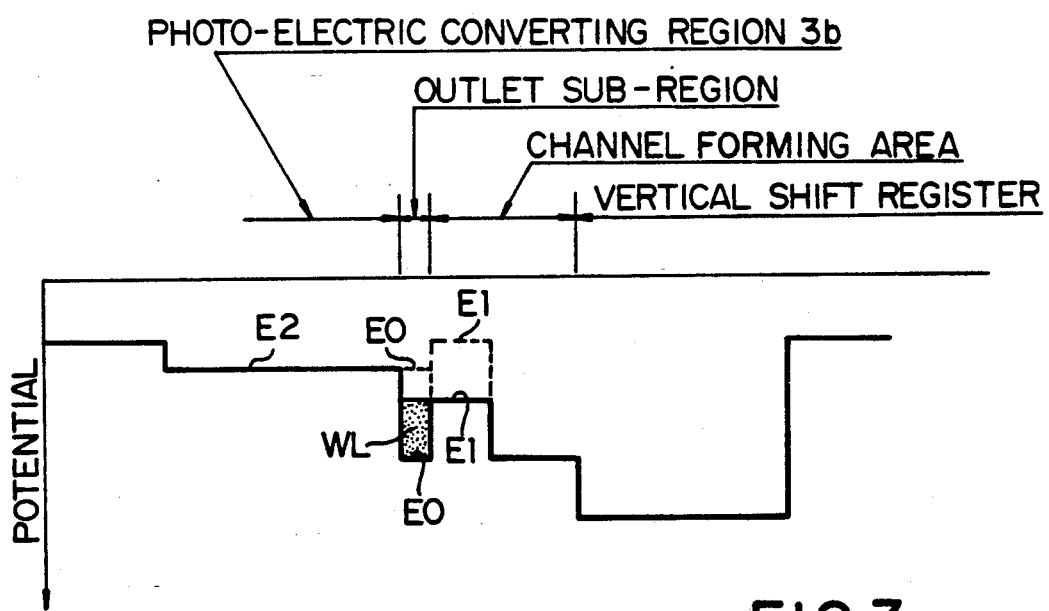
FIG. 3 is an energy diagram showing the bottom edges of conduction bands created in the prior art solid-state image pick-up device.
Figure 4:
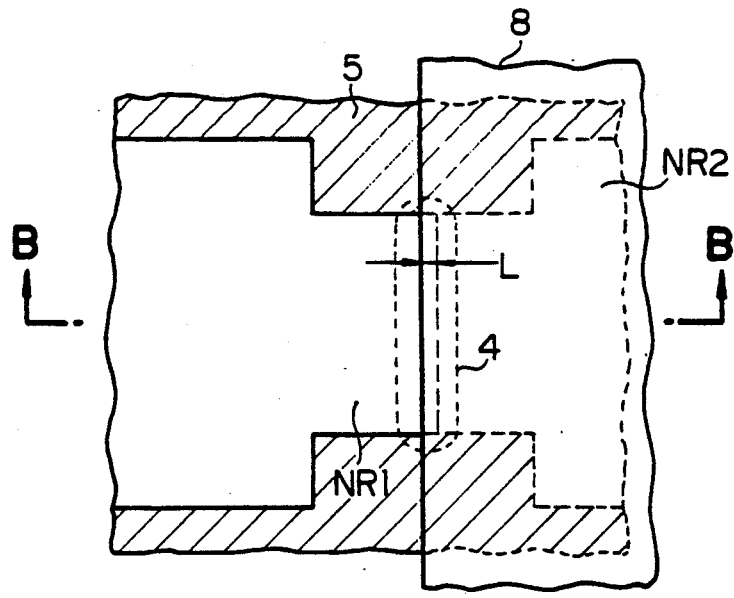
FIG. 4 is a plan view showing an extremely short outlet subregion formed in another prior art solid-state image pick-up device.
Figure 5:
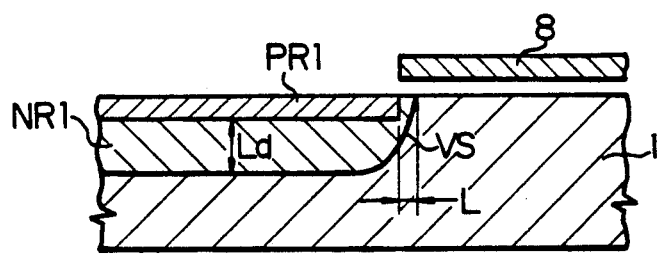
FIG. 5 is a cross sectional view taken along line B—B of FIG. 4 and showing the structure of the prior art solid-state image pick-up device.
Figure 6:
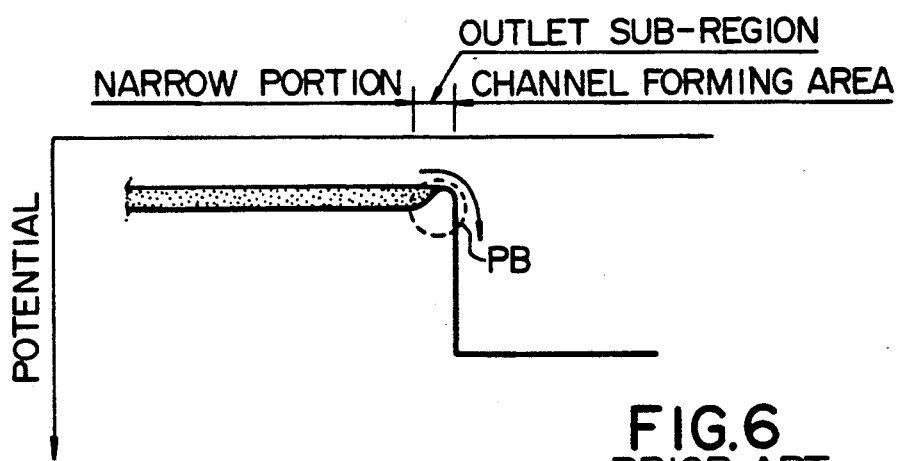
FIG. 6 is an energy diagram showing the bottom edges of conduction bands created in around the outlet subregion shown in FIG. 4.
Figure 7:
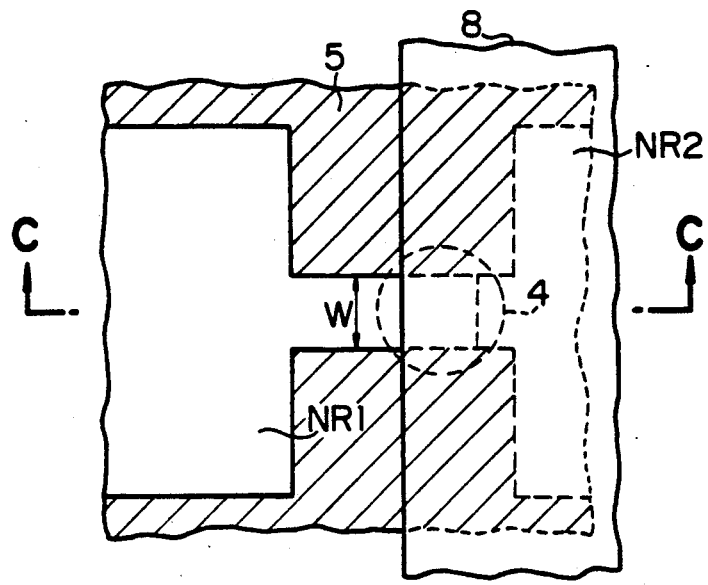
FIG. 7 is a plan view showing an extremely narrow outlet subregion formed in still another prior art solid-state image pick-up device.
Figure 8:
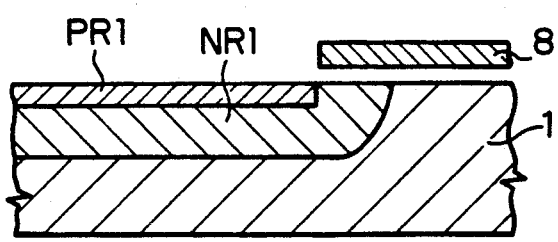
FIG. 8 is a cross sectional view taken along line C—C of FIG. 7 and showing the structure of the prior art solid-state image pick-up device.
Figure 9:
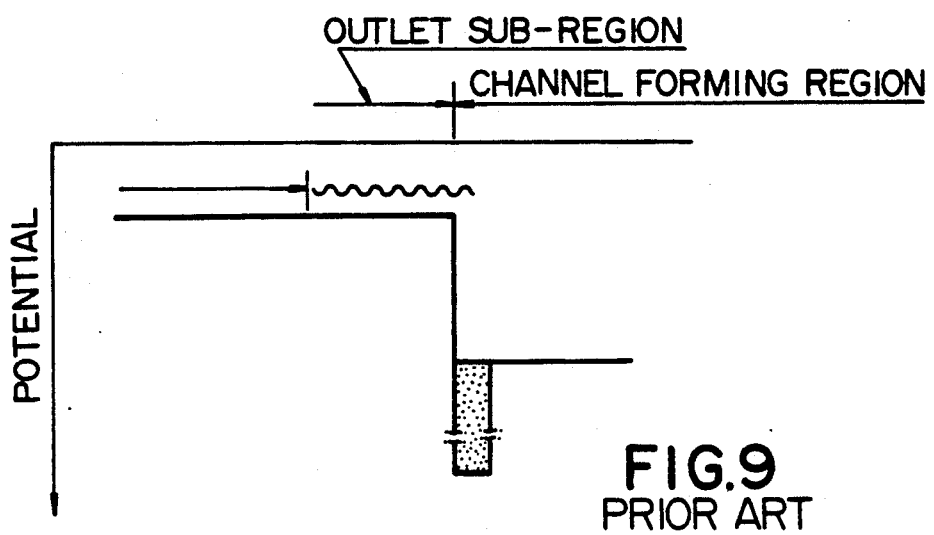
FIG. 9 is an energy diagram showing the bottom edges of conduction bands created in around the outlet subregion shown in FIG. 7.
Figure 10A:
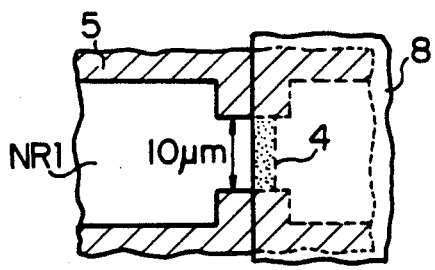
FIGS. 10A and 10B are plan views showing two outlet subregions different in width.
Figure 10B:
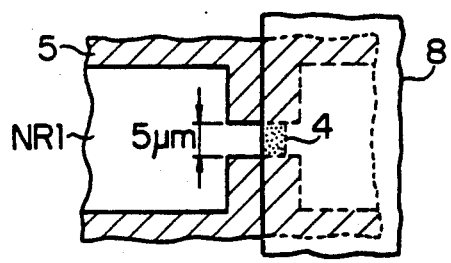
Figure 10C:
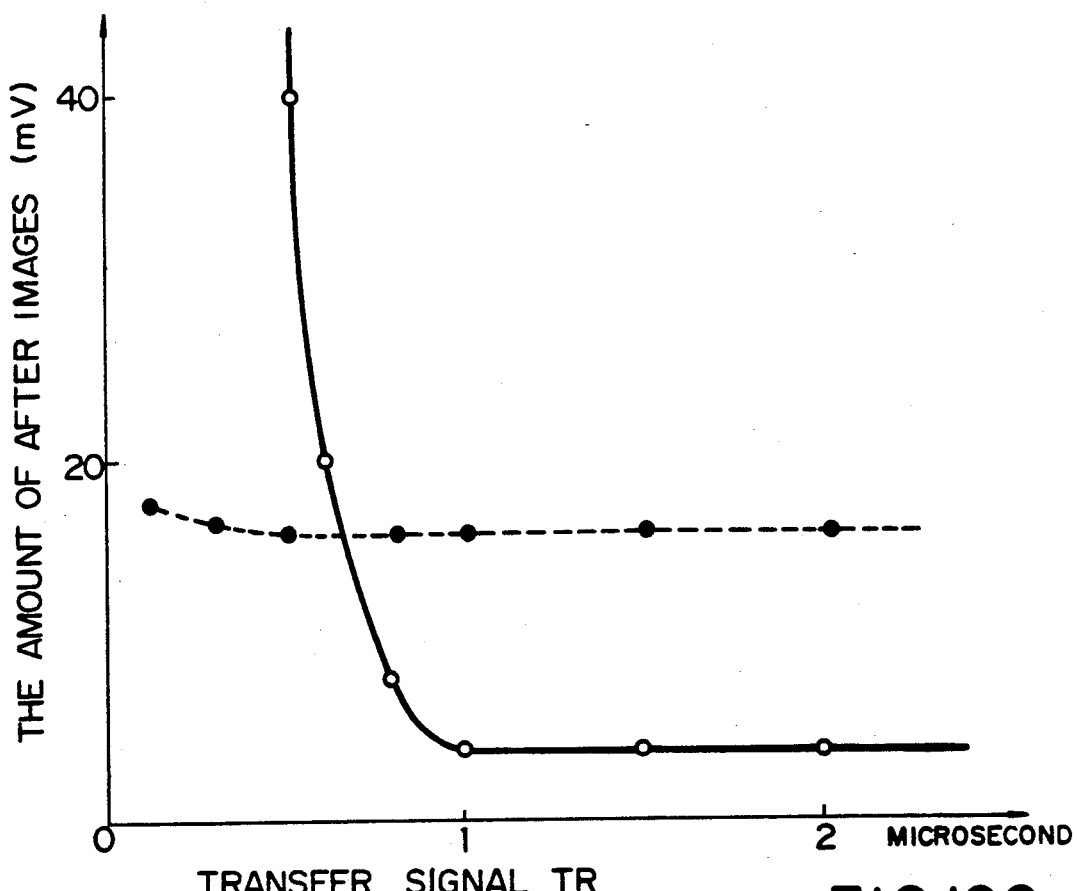
FIG. 10C is a graph showing the amount of after images caused outlet subregions shown in FIGS. 10A and 10B.
Figure 11:
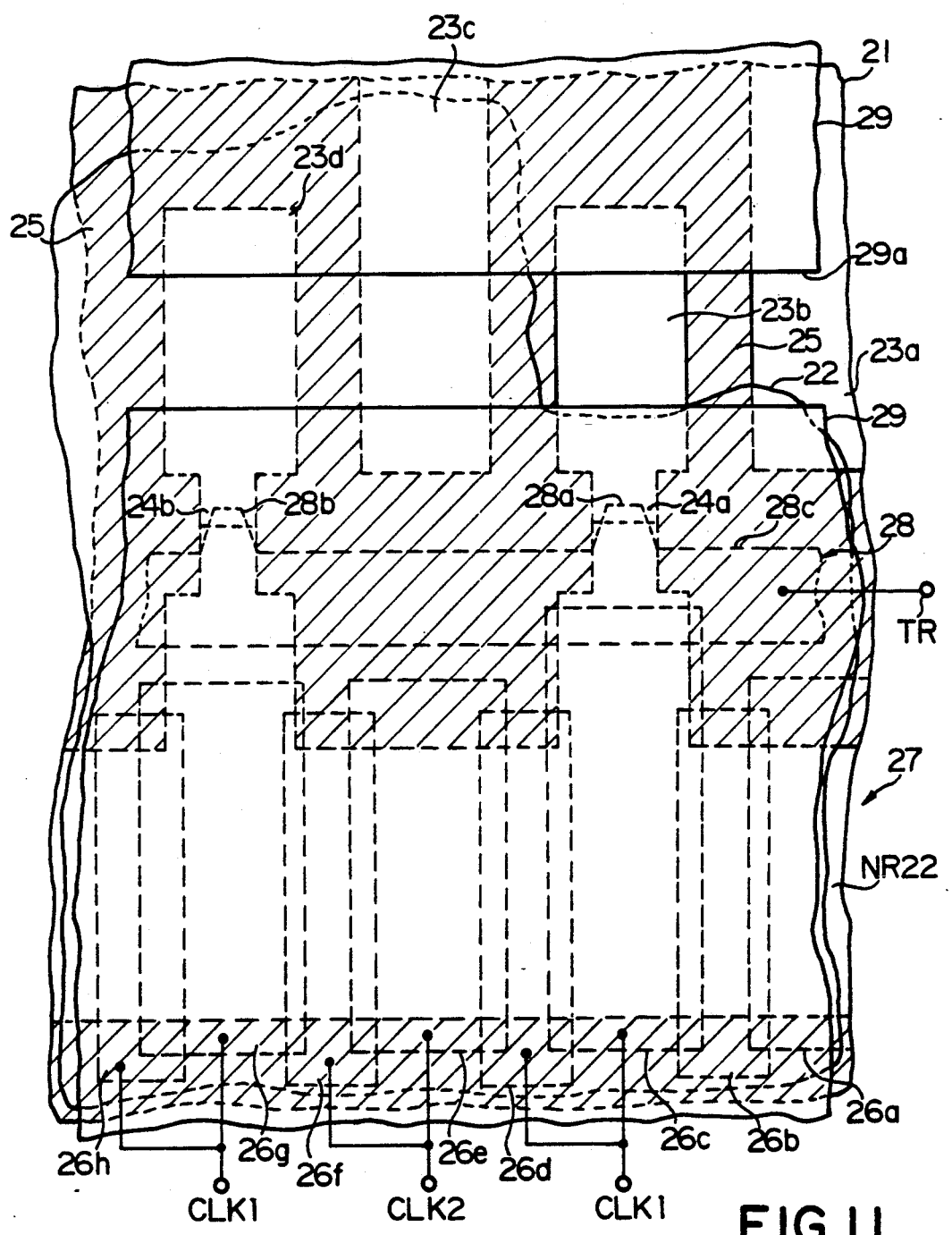
FIG. 11 is a plan view showing the layout of a solid-state image pick-up device according to the present invention.
Figure 12:
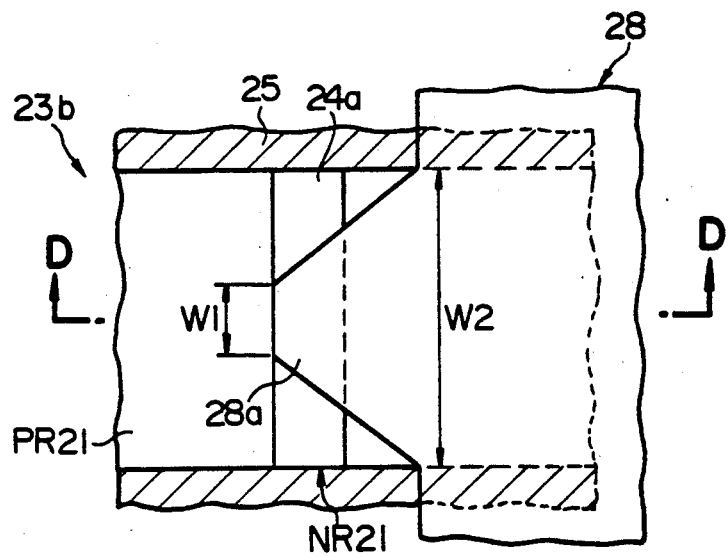
FIG. 12 is a plan view showing, in an enlarged scale, the layout around an outlet subregion incorporated in the solid-state image pick-up device shown in FIG. 11.
Figure 13:
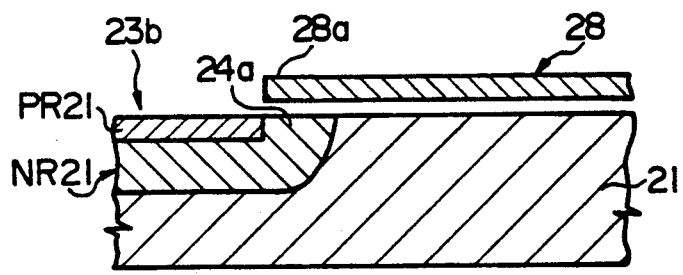
FIG. 13 is a cross sectional view taken along line D—D of FIG. 12 and showing the structure of the solid-state image pick-up device.

Referring to FIGS. 11 to 13 of the drawings, a solid-state image pick-up device embodying the present invention is fabricated on a lightly doped p-type silicon substrate 21. Although a thick oxide film 22 covers the entire surface of the silicon substrate 1, the thick oxide film 22 is partially removed from the silicon substrate 21 in FIG. 11 for better understanding. The thick oxide film 22 is perfectly removed in FIGS. 12 and 13.

In the silicon substrate 21 are formed a plurality of n-type rectangular regions NR21 arranged in staggered manner which provide photo-electric converting regions 23a, 23b, 23c and 23d together with associated p-type impurity regions PR21 overlapped therewith as will be better seen from FIGS. 12 and 13. Another n-type impurity region NR22 is formed in the silicon substrate 21, and is connectable to every other photoelectric converting region 23b/23d through a p-type channel forming area. The n-type impurity region NR22 serves as a charge transfer region. The n-type rectangular regions 23b and 23d have respective outlet subregions 24a and 24b, and the outlet subregions 24a and 24b are contiguous to the associated channel forming regions, respectively. The n-type rectangular regions NR21 and the n-type impurity region NR22 are surrounded by a heavily doped p-type channel stopper 25 which is hatched in the drawings so as to easily discriminated from n-type impurity regions NR21 and NR22. In this instance, the n-type rectangular impurity regions NR21 serve as first impurity regions, and the p-type impurity region PR21 as a second impurity region.

A large number of gate electrodes 26a, 26b, 26c, 26d, 26e, 26f, 26g and 26h are provided over the n-type impurity region NR22, and each of the gate electrodes 26a to 26h is partially overlapped with those located on both sides thereof. A phase-one transferring clock signal CLK1 and a phase-two transferring clock signal CLK2 are selectively supplied to the gate electrodes 26a to 26h, and the n-type impurity region NR22 and the gate electrodes 26a to 26h as a whole constitute a multi-stage vertical shift register 27 of the CCD type. Although the n-type rectangular impurity regions 23a and 23c have also respective outlet subregions and are associated with another vertical shift register, these outlet subregions and the vertical shift register are not shown in the drawings. Moreover, the vertical shift registers are coupled to a horizontal shift register (not shown) in a case of area image pick-up device, and an image carrying signal is transferred from the photo-electric converting regions 23a to 23d through the vertical shift registers 27 and the horizontal shift register to an external device. In a case of linear image pick-up device, the image carrying signal is transferred to an external device through only one vertical shift register 27. The image carrying signal reproduces images on a display unit (not shown).

A transfer gate electrode 28 extends over the p-type channel forming areas contiguous to the outlet subregions 24a and 24b, and has projections 28a and 28b overlapped with the outlet subregions 24a and 24b, respectively. A transfer signal TR is supplied to the transfer gate electrode 28, and allows electric charges accumulated in the photo-electric converting region 23b and 23d to flow into the vertical shift register 27.

Figure 14:
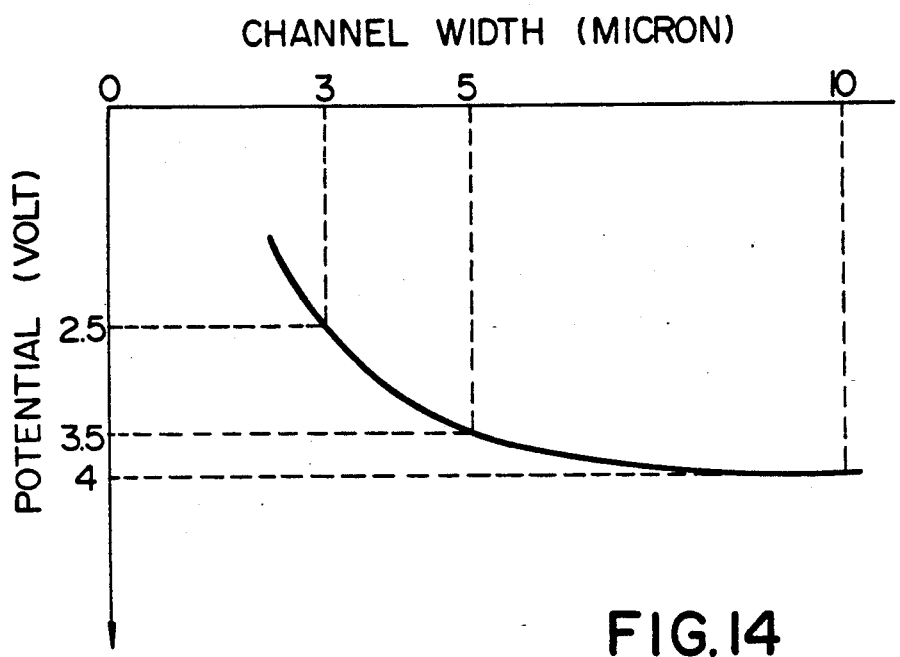
FIG. 14 is a graph showing potential of a conductive channel in the presence of narrow channel effect.
Figure 15:
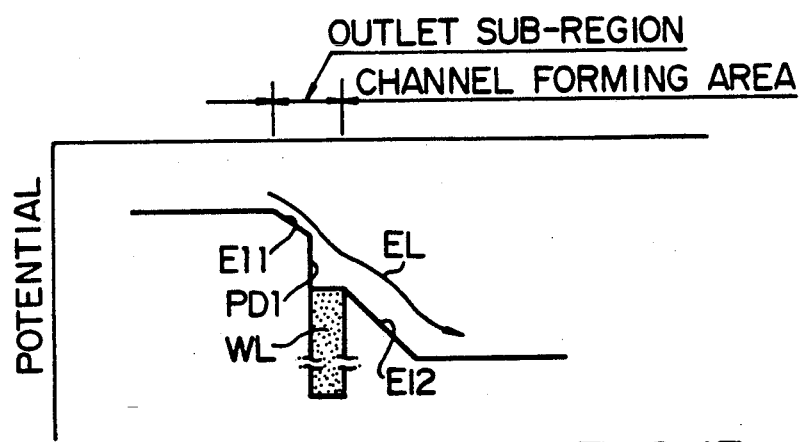
FIG. 15 is an energy diagram showing the bottom edges of the conduction bands created around the outlet subregion shown in FIG. 12.

As will be better seen from FIGS. 11 and 12, each of the projections 28a and 28b projects from a boss portion 28c and is shaped into a trapezoidal configuration. Two parallel segments of the trapezoidal configuration are labeled with W1 and W2, respectively. The segment W2 is as long as the distance defined by the heavily doped channel stopper 25. The trapezoidal projection 28a or 28b causes a conductive channel to increase the width toward the vertical shift register 28, and narrow channel effect takes place in the conductive channel. FIG. 14 illustrates the narrow channel effect. If the channel width is increased from 3 microns to 10 microns, the potential of the conductive channel is increased from 2.5 volts to 4.0 volts in the presence of 5 volts at a gate electrode over the conductive channel. In this instance, W1 and W2 are adjusted to about 3 microns and about 10 microns, respectively, and potential difference of about 1.5 volts takes place along the projection 28a or 28b in the presence of the transfer signal TR of about 5 volts. Thus, an electric field is produced over the outlet subregion 24a or 24b and the associated channel forming region, and the energy diagram is illustrated in FIG. 15. Namely, the oblique bottom edges E11 and E12 are representative of the electric field due to the narrow channel effect in the presence of the transfer signal TR of about 5 volts, and a potential discontinuity PD1 takes place therebetween. Electric charges EL produced by photo radiation are accelerated by the electric field, and the channel forming area allows a large amount of the electric charges to flow rather than the channel forming area of the prior art solid-state image pick-up device. The segment W1 is so small that a potential well WL can accumulate an extremely small amount of electric charges. However, the narrow segment W1 never leaves electric charges, because the electric charges EL are accelerated in the presence of the electric field. The electric charges surely reach the vertical shift register 27 while the transfer signal TR remains in the high voltage level of about 5 volts, and the solid-state image pick-up device surely improves the quality of images reproduced on the associated display unit.

The solid-state image pick-up device thus arranged is covered with a photo-shield plate 29, and a slit 29a formed in the photo-shield plate 29 exposes the photoelectric converting regions 23a to 23d to photo radiation carrying images.

The image pick-up operation carried out by the solid-state image pick-up device according to the present invention is similar to that of the prior art solid-state image pick-up device except for the amount of after images, and no further description is incorporated for the sake of simplicity.

In the solid-state image pick-up device according to the present invention, the ratio of W1 to W2 is regulated to a certain value for allowing the narrow channel phenomenon to take place. First, if W2 is greater than 10 microns, the advantage of the present invention is hardly achieved, and, therefore, W2 is equal to or less than about 10 microns. W1 should be decreased for the narrow channel phenomenon. If W1 is 80% of W2, the narrow channel phenomenon can be expected, and W1 may be decreased to the minimum dimension allowable through a lithographic process. One of the commercial products fabricated by the applicant, W1 and W2 are adjusted to about 3 microns and about 8 microns, respectively.

SECOND EMBODIMENT

Figure 16:
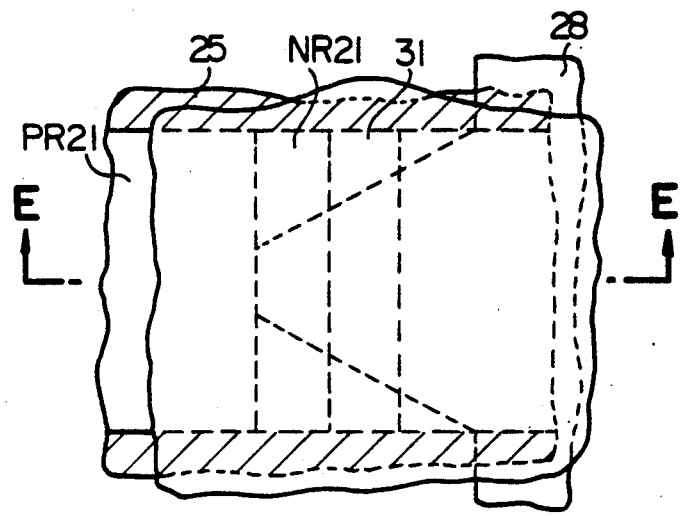
FIG. 16 is a plan view showing the layout of an essential part of another solid-state image pick-up device according to the present invention.
Figure 17:
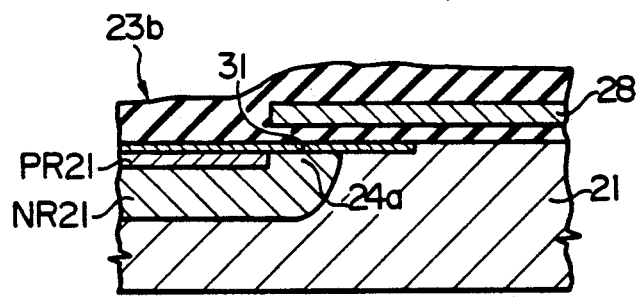
FIG. 17 is a cross sectional view taken along line E—E and showing the structure of the essential part shown in FIG. 16.
Figure 18:
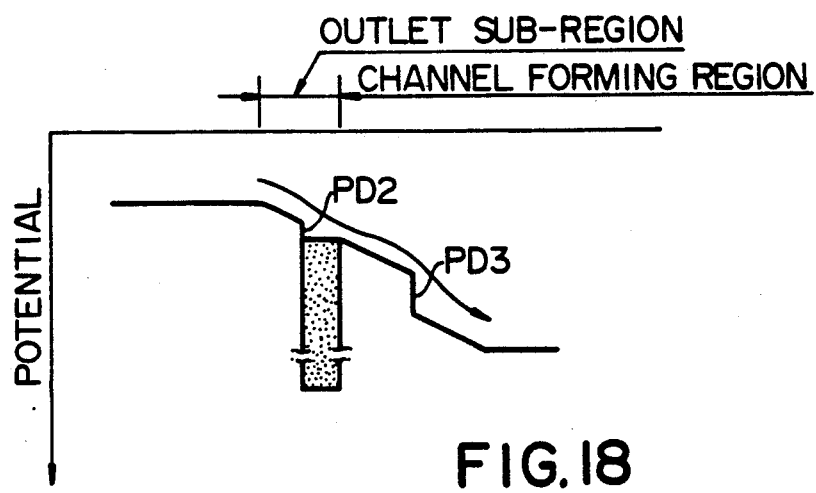

Turning to FIGS. 16 and 17, an essential part of another solid-state image pick-up device embodying the present invention is illustrated, and is similar to the first embodiment except for a third p-type impurity region 31 formed through ion-implantation. For this reason, other regions and films are designated by the same references used in FIGS. 12 and 13 without any detailed description. The third p-type impurity region 31 covers not only the outlet subregion 24a but also a part of the channel forming area, and two potential discontinuities PD2 and PD3 take place in the bottom edges of the conduction bands as shown in FIG. 18. The bottom edges of the conduction bands are representative of an electric field stronger than that of the first embodiment, and electric charges produced by photo radiation are accelerated by the strong electric field. This enhances the charge transfer efficiency of the channel forming area.

As will be understood from the foregoing description, the solid-state image pick-up device according to the present invention drastically reduces residual electric charge by virtue of the electric field created along the outlet subregion and the channel forming area, and after images are less liable to take place on a display unit.

Although particular embodiments of the present invention have been shown and described, it will be obvious to those skilled in the art that various changes and modifications may be made without departing from the spirit and scope of the present invention. For example, various configurations are applicable to each of the projections 28a and 28b in so far as the narrow channel effect takes place.

What is claimed is:

1. A solid-state image pick-up device comprising
  a) a semiconductor substrate of a first conductivity type,
  b) a plurality of photo-electric converting regions having first impurity regions of a second conductivity type opposite to said first conductivity type, respectively, and formed in a surface portion of said semiconductor substrate at spacings, said plurality of photo-electric converting regions respectively having second impurity regions of said first conductivity type overlapped with the associated first impurity regions except for outlet subregions so that said first impurity regions are buried beneath the associated second impurity regions, said outlet subregions being inside said semiconductor substrate,
  c) a shift register having a charge transfer region of said second conductivity type separated from said first impurity regions by respective channel forming regions of said first conductivity type, each of said channel forming region being exposed to a surface of said semiconductor substrate,
  d) a thin insulating film covering said channel forming regions and said outlet subregions of said first impurity regions, said outlet subregions being contiguous to said channel forming regions, respectively, and
  e) a transfer gate electrode extending on said thin insulating film, and having a boss portion provided for said outlet subregions and said associated channel forming regions and projections each projecting from said boss portion and shaped in such a manner as to create an electric field over each outlet subregion and said associated channel forming region for accelerating carriers from said each outlet subregion through said associated channel forming region to said shift register, each of said projections having a trapezoidal configuration decreased in width toward the leading end thereof.

2. A solid-state image pick-up device as set forth in claim 1, in which said first impurity regions and said charge transfer region are surrounded by a channel stopper of said first conductivity type.

3. A solid-state image pick-up device as set forth in claim 2, in which said shift register further has a plurality of gate electrodes supplied with a multi-phase transferring signal.

4. A solid-state image pick-up device as set forth in claim 3, in which said transfer gate electrode and said plurality of gate electrodes are covered with a thick insulating film, and in which a photo-shield plate is provided on said thick insulating film, an aperture being formed in said photo-shield plate for exposing said photo-electric converting regions to photo radiation.

5. A solid-state image pick-up device as set forth in claim 2, in which each of said photo-electric converting regions further has a third impurity region of said first conductivity type shallower than said second impurity region and extending on said outlet subregion and on a part of said channel forming region contiguous to said outlet subregion.

* * * * *